US009058934B2

(12) United States Patent
Yao et al.

(10) Patent No.: US 9,058,934 B2
(45) Date of Patent: Jun. 16, 2015

(54) METHOD OF FORMING A VDF OLIGOMER OR CO-OLIGOMER FILM ON A SUBSTRATE AND AN ELECTRICAL DEVICE COMPRISING THE VDF OLIGOMER OR CO-OLIGOMER FILM ON THE SUBSTRATE

(75) Inventors: Kui Yao, Singapore (SG); Shuting Chen, Singapore (SG); Eng Hock Francis Tay, Singapore (SG)

(73) Assignees: Agency for Science, Technology and Research, Singapore (SG); National University of Singapore, Singapore (SG)

( * ) Notice: Subject to any disclaimer, the term of this patent is extended or adjusted under 35 U.S.C. 154(b) by 240 days.

(21) Appl. No.: 13/518,866

(22) PCT Filed: Dec. 23, 2009

(86) PCT No.: PCT/SG2009/000494
§ 371 (c)(1),
(2), (4) Date: Jun. 22, 2012

(87) PCT Pub. No.: WO2011/078791
PCT Pub. Date: Jun. 30, 2011

(65) Prior Publication Data
US 2012/0313482 A1    Dec. 13, 2012

(51) Int. Cl.
*H01L 41/09* (2006.01)
*H01G 4/18* (2006.01)
(Continued)

(52) U.S. Cl.
CPC ............... *H01G 4/18* (2013.01); *H01L 41/193* (2013.01); *H01L 41/45* (2013.01); *H01L 41/317* (2013.01)

(58) Field of Classification Search
USPC ........................................ 310/311; 361/301.1
See application file for complete search history.

(56) References Cited

U.S. PATENT DOCUMENTS

| 4,173,033 A | 10/1979 | Sako et al. |
| 4,615,943 A | 10/1986 | Sakagami et al. |

(Continued)

FOREIGN PATENT DOCUMENTS

WO    WO 2006/121336 A1    11/2006

OTHER PUBLICATIONS

PCT International Search Report for PCT Counterpart Application No. PCT/SG2009/000494 containing Communication relating to the Results of the International Search Report, 3 pgs., (Feb. 12, 2010).

(Continued)

*Primary Examiner* — Thomas Dougherty
(74) *Attorney, Agent, or Firm* — Blakely, Sokoloff, Taylor & Zafman LLP

(57) ABSTRACT

A method of forming a vinylidene fluoride (VDF) oligomer or co-oligomer film on a substrate is disclosed. The method comprises forming a VDF oligomer or co-oligomer precursor solution; depositing the VDF oligomer or co-oligomer precursor solution onto the substrate to form a preliminary VDF oligomer or co-oligomer film on the substrate; and applying uniaxial pressure on the preliminary VDF oligomer or co-oligomer film and the substrate at an elevated temperature to form the VDF oligomer or co-oligomer film on the substrate. The substrate may comprise a metal surface which may be used as a bottom electrode and a top electrode may be deposited on the VDF oligomer or co-oligomer film. The VDF oligomer or co-oligomer film, the bottom electrode on the substrate and the top electrode on the VDF oligomer or co-oligomer film form an electrical device.

14 Claims, 18 Drawing Sheets

(51) Int. Cl.
*H01L 41/193* (2006.01)
*H01L 41/45* (2013.01)
*H01L 41/317* (2013.01)

(56) References Cited

U.S. PATENT DOCUMENTS

| | | | |
|---|---|---|---|
| 7,291,859 B2 * | 11/2007 | Liljedahl et al. | 257/40 |
| 7,482,624 B2 * | 1/2009 | Liljedahl et al. | 257/40 |
| 8,226,876 B1 * | 7/2012 | Hughes et al. | 264/331.14 |
| 2004/0171773 A1 * | 9/2004 | Bu et al. | 526/72 |
| 2015/0005456 A1 * | 1/2015 | Marrani et al. | 525/376 |

OTHER PUBLICATIONS

PCT Written Opinion of the International Searching Authority for PCT Counterpart Application No. PCT/SG2009/000494, 5 pgs., (Feb. 12, 2010).

PCT Written Opinion of the International Preliminary Examining Authority for PCT Counterpart Application No. PCT/SG2009/000494, 4 pgs., (Dec. 16, 2010).

PCT International Preliminary Report on Patentability (Chapter II of the Patent Cooperation Treaty) for PCT Counterpart Application No. PCT/SG2009/000494, 4 pgs., (Apr. 24, 2012).

* cited by examiner (a)

(b)

(a)

(b)

ness than 1 J/cm³.
METHOD OF FORMING A VDF OLIGOMER OR CO-OLIGOMER FILM ON A SUBSTRATE AND AN ELECTRICAL DEVICE COMPRISING THE VDF OLIGOMER OR CO-OLIGOMER FILM ON THE SUBSTRATE

CROSS-REFERENCE TO RELATED APPLICATION

This patent application is a U.S. National Phase Application under 35 U.S.C. §371 of International Application No. PCT/SG2009/000494, filed Dec. 23, 2009, entitled A METHOD OF FORMING A VDF OLIGOMER OR CO-OLIGOMER FILM ON A SUBSTRATE AND AN ELECTRICAL DEVICE COMPRISING THE VDF OLIGOMER OR CO-OLIGOMER FILM ON THE SUBSTRATE.

TECHNICAL FIELD

This invention relates to a method of forming a vinylidene fluoride (VDF) oligomer or co-oligomer film on a substrate and refers particularly, though not exclusively, to a method of forming a VDF oligomer or co-oligomer film on a substrate to be used to form an electrical device.

BACKGROUND

Power electronics and electric power systems for many practical applications often require storage devices (for example, capacitors) with high energy densities to enable miniaturization of circuits and devices. For example, in the design of implantable cardiac defibrillators, energy, volume and mass are critical features. One component important to the optimization of these features is the high voltage capacitor used to store the energy required for defibrillation. Such a capacitor tends to be bulky as it is required to deliver energy in the range of about 25 to 40 Joules. It is preferable if the volume and mass of this capacitor can be reduced as this can be beneficial to patient comfort. It can also minimize the occurrence of complications due to erosion of tissue around the storage device. Reductions in the size of the capacitor can also allow for a balanced addition of volume to the battery, thereby adding functionality to the circuit or device.

For many other conventional power converters and pulse power systems, the capacitor size may be a concern since capacitors often occupy more than 50% of the overall volume. Thus, it is desirable to reduce the volume and mass of capacitors in power electronics and electric power systems without reducing the amount of deliverable energy.

Ceramic-based dielectric materials generally have a relatively low breakdown field. As such there may be a high chance of catastrophic failure under a high electric field when ceramic-based dielectric materials are used. Thus, these ceramic-based dielectric materials have a low electric energy density (approximately 1 J/cm³). Conventional polymeric dielectric materials, such as polypropylene (PP), polyethylene terephthalate (PET), and polycarbonate (PC) have a high breakdown electric field and have been used widely for high energy density capacitors. However, these polymers are linear dielectrics with very low dielectric constants, thus limiting the capacitance values of the capacitors. A realistic energy density of these polymers is typically not significantly higher than 1 J/cm³.

There have been a number of recent attempts to use poly (vinylidene fluoride) (PVDF) polymers and copolymers or their modified counterparts for high energy storage capacitor applications.

Even though attempts to use poly(vinylidene fluoride) (PVDF) polymers and copolymers or their modified counterparts have led to improved discharged energy densities with highest values up to 10-25 J/cm³, such levels may still not be sufficient and further improvement in the discharged energy densities is desired.

Vinylidene fluoride (VDF) oligomer typically comprises less than a few hundred units of —CH$_2$CF$_2$—, which has much smaller molecular weight than poly(vinylidene fluoride) (PVDF) polymers whereas VDF co-oligomer typically comprises less than a few hundred units of VDF and other monomers such as trifluoroethylene (TrFE). VDF oligomer or co-oligomer films may be useful for high energy storage capacitor applications.

It has been reported that a VDF oligomer film can be produced by thermal evaporation process. However, β-phase VDF oligomer films were only achieved using very specific substrates or at low temperature. The obtained VDF oligomer films do not possess the performance as desired for high energy density storage because the polarization hysteresis loops indicate small linear polarization and the largest polarization P$_m$ is rather low. There have been several proposals for the preparation of VDF oligomer films from solutions using the technique of Langmuir-Blodgett deposition or solution casting. However, the solution-derived VDF oligomer films have poor morphologies or structures, and do not show any useful electrical properties.

There is hence a need for a dielectric material with improved electrical properties, particularly improved energy density, and a method of forming such a dielectric material.

SUMMARY

According to an exemplary aspect, there is provided a method of forming a VDF oligomer or co-oligomer film on a substrate, the method comprising: forming a VDF oligomer or co-oligomer precursor solution; depositing the VDF oligomer or co-oligomer precursor solution onto the substrate to form a preliminary VDF oligomer or co-oligomer film on the substrate; and applying uniaxial pressure on the preliminary VDF oligomer or co-oligomer film and the substrate at an elevated temperature to form the VDF oligomer or co-oligomer film on the substrate.

The application of uniaxial pressure on the preliminary VDF oligomer or co-oligomer film and the substrate at an elevated temperature can advantageously increase the density of the resulting VDF oligomer or co-oligomer film and in turn eliminate cracks in the resulting VDF oligomer or co-oligomer film. This can improve the electrical properties of the resulting VDF oligomer or co-oligomer film. For example, the resulting VDF oligomer or co-oligomer film can achieve low dielectric losses, high dielectric strengths, large polarizations, high electric energy densities and high remnant polarizations.

An electrical device comprising a VDF oligomer or co-oligomer film formed according to the exemplary aspect may be used in many applications such as, for example: high energy density capacitors for power electronics, electrical power systems, medical devices and electric weapons; ferroelectric random access memory (FRAM); pyroelectric devices for infra red and non-contact temperature detection; and piezoelectric sensors.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings.

In the drawings.

DETAILED DESCRIPTION OF THE EXEMPLARY EMBODIMENTS

Figure 1:
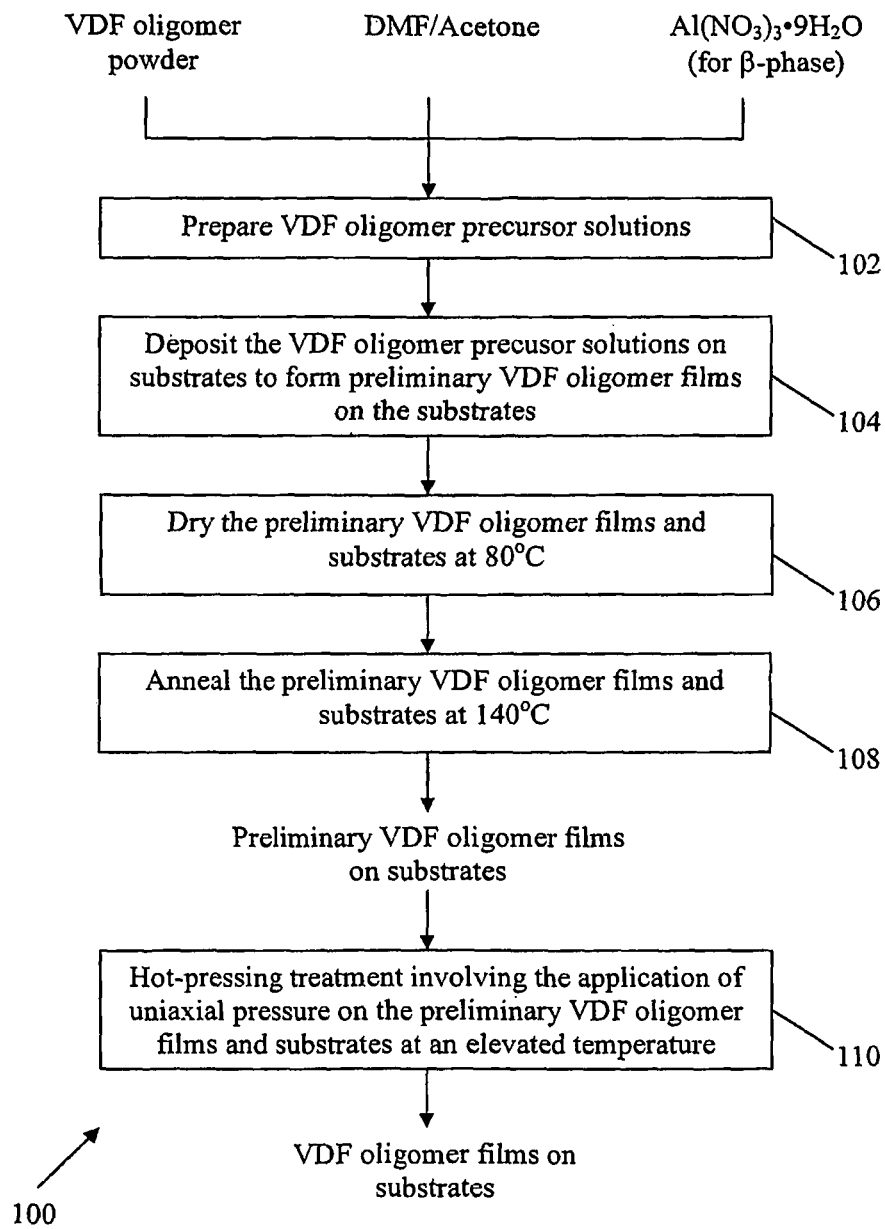
FIG. 1 illustrates a flow diagram of a method of forming VDF oligomer films on substrates according to an embodiment of the present invention.

In the exemplary embodiments, VDF oligomer or co-oligomer films are prepared. Referring to FIG. 1, the steps are illustrated of a method 100 which is an embodiment of the present invention, and which is used for the preparation of VDF oligomer films. Although VDF oligomers are used in method 100 to prepare VDF oligomer films, VDF-based co-oligomers such as a combination of vinylidene fluoride and trifluoroethylene (VDF-TrFE) can also be used to produce VDF-based co-oligomer films using the same steps as described in method 100.

Method 100 comprises a number of process stages 102-110. At 102, VDF oligomer precursor solutions with and without hydrated salt are prepared and, at 104, these solutions are deposited on substrates to form preliminary VDF oligomer films on the substrates. The preliminary VDF oligomer films together with the substrates are dried at a temperature of 80° C. at 106 and are then annealed at a temperature of 140° C. at 108. At 110, hot-pressing treatment is performed on the preliminary VDF oligomer films and substrates to obtain the final VDF oligomer films. The hot-pressing treatment involves the application of uniaxial pressure on the preliminary VDF oligomer films and substrates at an elevated temperature.

At 102, VDF oligomer precursor solutions are prepared by dissolving solid VDF oligomer at a concentration of about 5 wt % in a solvent comprising dimethylformamide (DMF) and acetone. The solid VDF oligomer commercially available can be in powder form and its molecular formula typically contains 10-30 units of —$CH_2CF_2$—. To promote the crystallization of the polar β-phase of VDF oligomer with the polar all-trans conformation and ferroelectric properties in some of the final VDF oligomer films, hydrated salt such as aluminum nitrate nonahydrate ($Al(NO_3)_3.9H_2O$) is added in some of the VDF oligomer precursor solutions at a concentration of about 0.4 wt % (the corresponding concentration of $Al(NO_3)_3.9H_2O$ in the final VDF oligomer films is about 8 wt %). The VDF oligomer precursor solutions with and without aluminium nitrate nonahydrate ($Al(NO_3)_3.9H_2O$) are then heated at 55° C. to completely dissolve the solid VDF oligomer to obtain homogeneous VDF oligomer precursor solutions.

Figure 2:
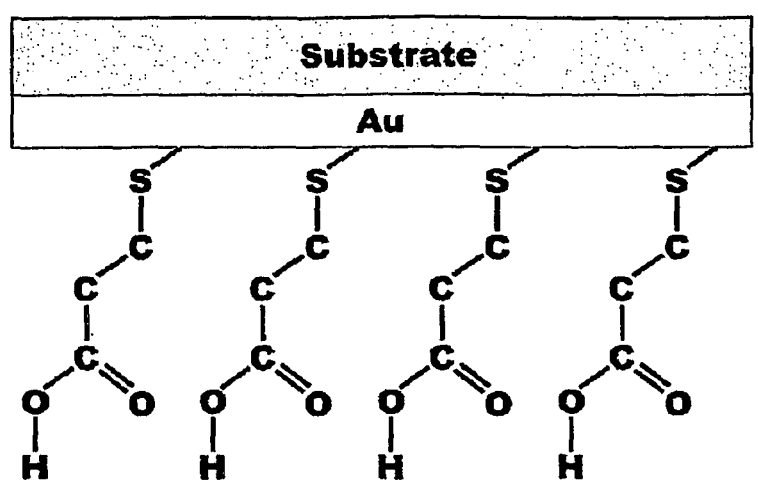
FIG. 2 illustrates a schematic diagram of a substrate comprising a chemically functionalized metal surface.

At 104, the VDF oligomer precursor solutions are deposited on substrates to form preliminary VDF oligomer films on the substrates. The substrates may be coated with a metal layer prior to the deposition of the VDF oligomer film and the metal layer coated on the substrate may be used as a bottom electrode for an electric device using the VDF oligomer film. In one example, silicon wafers with (100) orientation are used as the substrates. $SiO_2$ layers are formed on the surfaces of the silicon substrates by thermal oxidation and metal layers, such as Au or Au/Ti electrode layers, are subsequently deposited on the $SiO_2$/Si substrates by a sputtering process to form the metal layer on the substrates wherein the metal layer may be used as the bottom electrode for an electric device using the VDF oligomer film. To enhance the wetting ability of the metal layers to the oligomer solutions so as to obtain smooth and continuous VDF oligomer films, the metal surfaces are chemically functionalized. In one example, the metal surfaces are chemically functionalized by treating the metal surfaces with 3-mercaptopropionic acid. This may be performed at room temperature. FIG. 2 illustrates an example of a substrate having a chemically functionalized metal surface (Au surface). Preliminary VDF oligomer films, each with a thickness between 1-4 μm, are then deposited on the substrates by casting the VDF oligomer precursor solutions on the substrates. This process is known as solution casting.

Subsequently, at 106, the preliminary VDF oligomer films, together with the substrates, are dried at a temperature of 80° C. At 108, the dried preliminary VDF oligomer films and substrates are then annealed at a temperature in the range of 100° C.-150° C. in an oven to complete the crystallization process.

Figure 3:
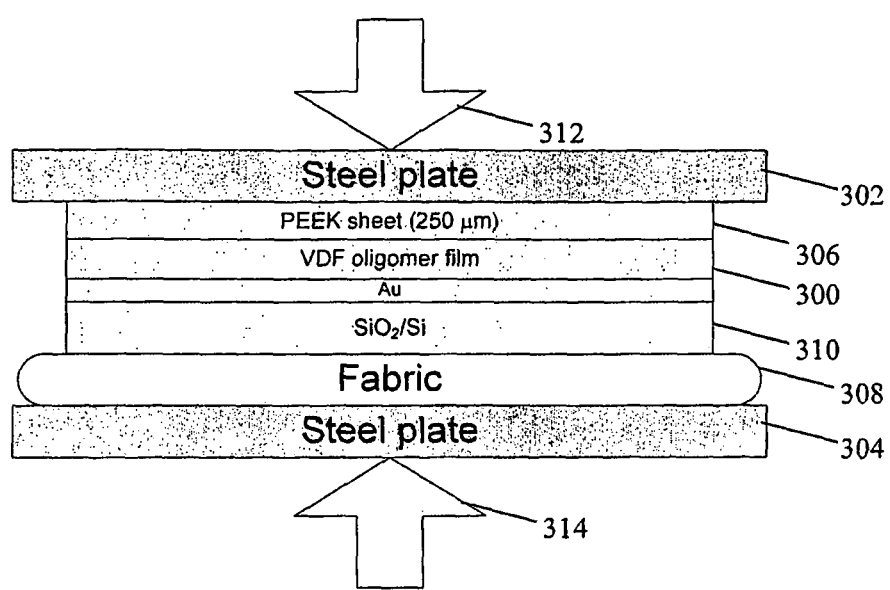
FIG. 3 illustrates an example of the hot-pressing treatment performed in the method of FIG. 1.

At 110, hot-pressing treatment is performed on the annealed preliminary VDF oligomer films and substrates obtained from 108. This involves the application of uniaxial pressure on each of the VDF oligomer films together with its substrate at an elevated temperature. In one example, the uniaxial pressure is in the range of 1-300 MPa (the preferred range is 30-120 MPa) and the elevated temperature is in the range of 80-135° C. FIG. 3 illustrates an example of the hot-pressing treatment performed at 110. As shown in FIG. 3, first and second plates 302 and 304 are placed on top of the preliminary VDF oligomer film 300 and below the substrate 310 (with the Au metal surface) respectively. In one example, first and second plates 302 and 304 are steel plates. In addition, to protect the preliminary VDF oligomer film 300 from damage due to its adhesion to the first plate 302, a smooth polymer sheet 306 is placed between the first plate 302 and the preliminary VDF oligomer film 300. In one example, the polymer sheet 306 is a polyaryletheretherketone (PEEK) polymer sheet. In addition, an elastic cushion layer such as the fabric layer 308 is placed between the substrate 310 and the second plate 304 to avoid the problem of applying uneven force onto the preliminary VDF oligomer film 300 and the substrate 310. As shown in FIG. 3, the hot-pressing treatment involves applying uniaxial pressure onto the preliminary VDF oligomer film 300 and the substrate 310 through the first plate 302 and the second plate 304. This is done by applying two equal and opposing forces, 312 and 314, along the same axis onto the first plate 302 and the second plate 304 respectively as shown in FIG. 3.

The hot-pressing treatment increases the densities of the VDF oligomer films and hence VDF oligomer films on substrates obtained after the hot-pressing treatment at 110 are referred to as dense VDF oligomer films. To produce a VDF oligomer thin film electrical device, top electrodes are formed on the top of the dense VDF oligomer film obtained from 110. In one example, the prior deposited Au layer on the substrate is used as the bottom electrodes, and the top electrodes are formed by depositing another metal layer, such as a gold layer, of 300 nm in thickness on the top of the dense VDF oligomer film by sputtering. The metal layer is then patterned either by using a shadow mask during sputtering or by a combination of photolithography and an etching process so as to form the top electrodes for the VDF oligomer thin film electrical device comprising the dense VDF oligomer film.

Crystalline structure analyses were performed at room temperature on VDF oligomer films (obtained from method 100) using an x-ray diffraction (XRD) system (D8-AD-VANCE, Bruker AXS GmbH, Karlsruhe, Germany) and Fourier transform infrared (FTIR) spectroscopy (Spectrum 2000, Perkin Elmer). The surface morphologies of these VDF oligomer films were also examined using field emission scanning electron microscopy (FESEM, JSM-6700F, JEOL). Furthermore, polarization-electric field (P-E) hysteresis loops of these VDF-oligomer films were studied with a standard ferroelectric testing unit (Precision Premier II, Radiant Technologies).

Figure 4:
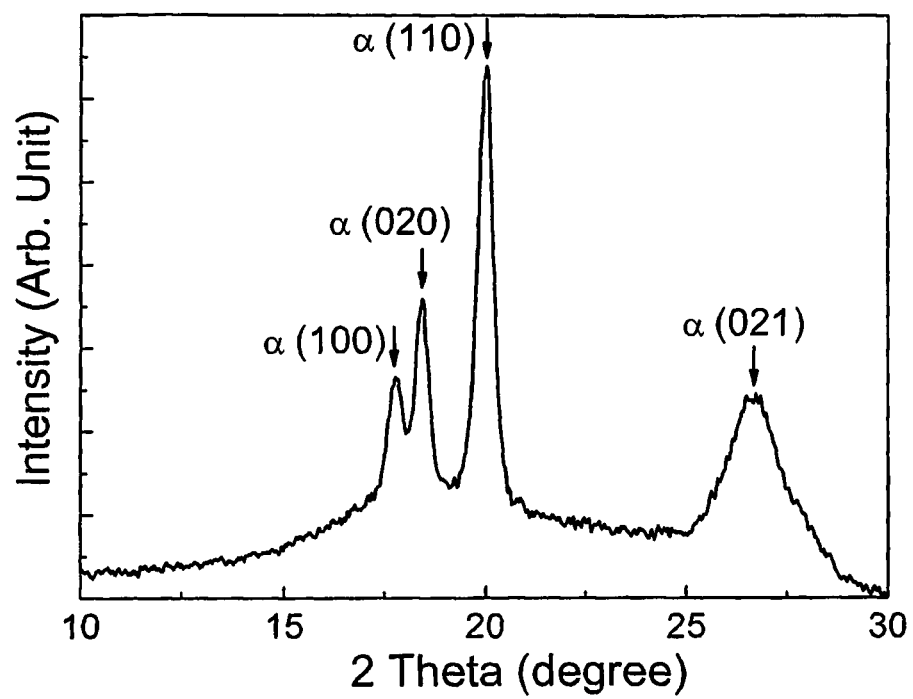
FIG. 4 illustrates a XRD pattern of an α-phase VDF oligomer film formed using the method of FIG. 1.
Figure 5:
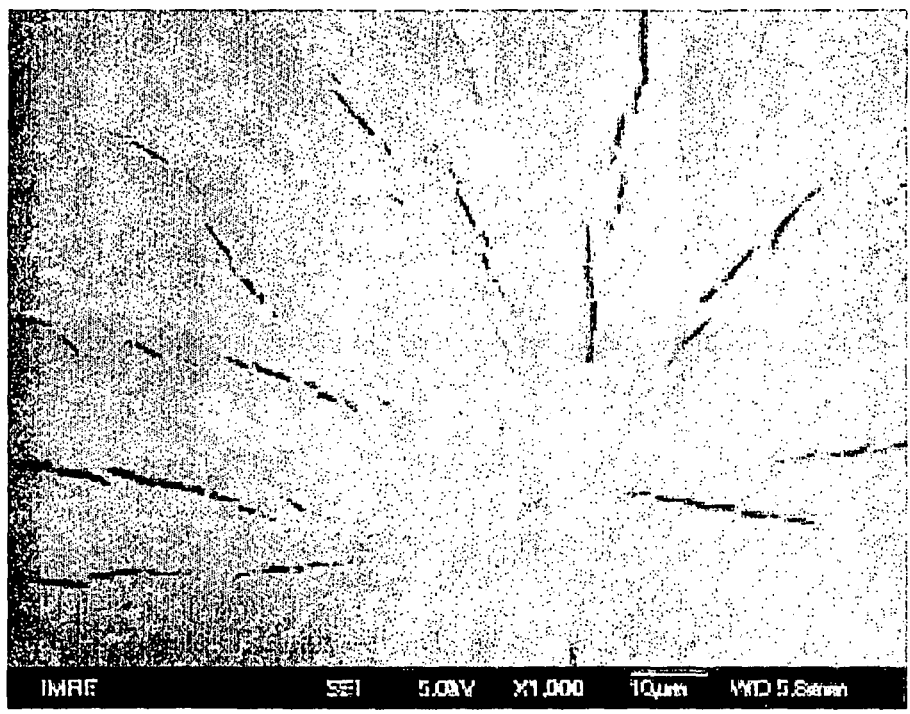
FIG. 5 illustrates a SEM image of a preliminary α-phase VDF oligomer film formed using the method of FIG. 1 before the hot-pressing treatment.

FIG. 4 shows a XRD pattern of a VDF oligomer film formed from a VDF oligomer precursor solution without hydrated salt and FIG. 5 shows a SEM image of a preliminary VDF oligomer film formed from a VDF oligomer precursor solution without hydrated salt before performing the hot-pressing treatment at 110 of method 100. As shown in FIG. 4, when no hydrated salt was added into the VDF oligomer precursor solution at 102, the casted and dried VDF oligomer film crystallized into a non-polar α-phase dominant structure. A VDF oligomer film with a non-polar α-phase dominant structure formed before the hot-pressing treatment is referred to as a preliminary α-phase VDF oligomer film. Microscopic observations as shown in the SEM image of FIG. 5 revealed that there are many cracks in the spherulites of the preliminary α-phase VDF oligomer film. The presence of these cracks results in electrical shorting and thus no electrical device can be formed from the preliminary α-phase VDF oligomer film obtained before performing the hot-pressing treatment at 110.

Figure 6:
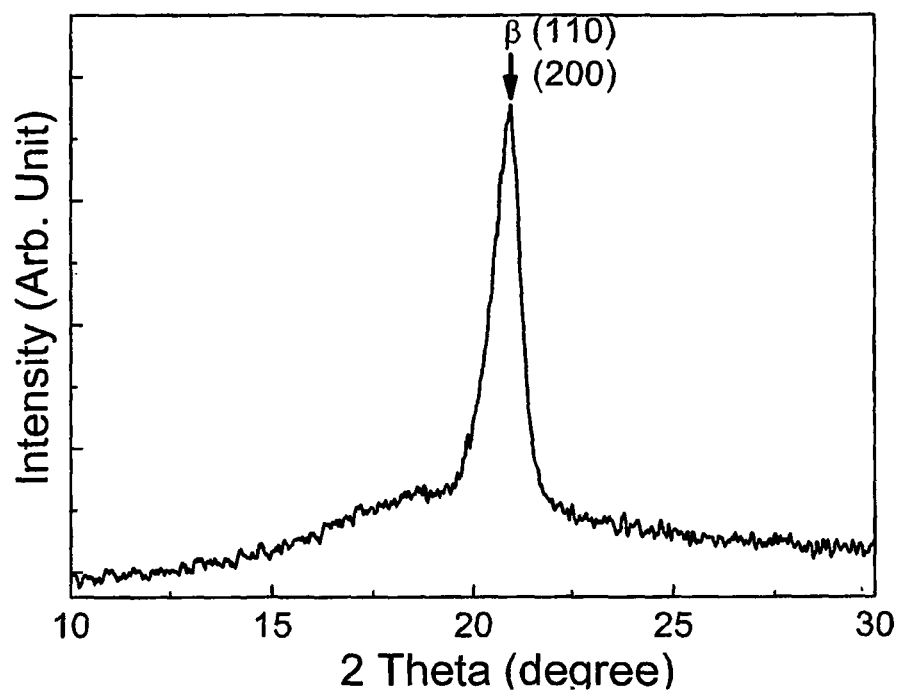
FIG. 6 illustrates a XRD pattern of a β-phase VDF oligomer film formed using the method of FIG. 1.
Figure 7:
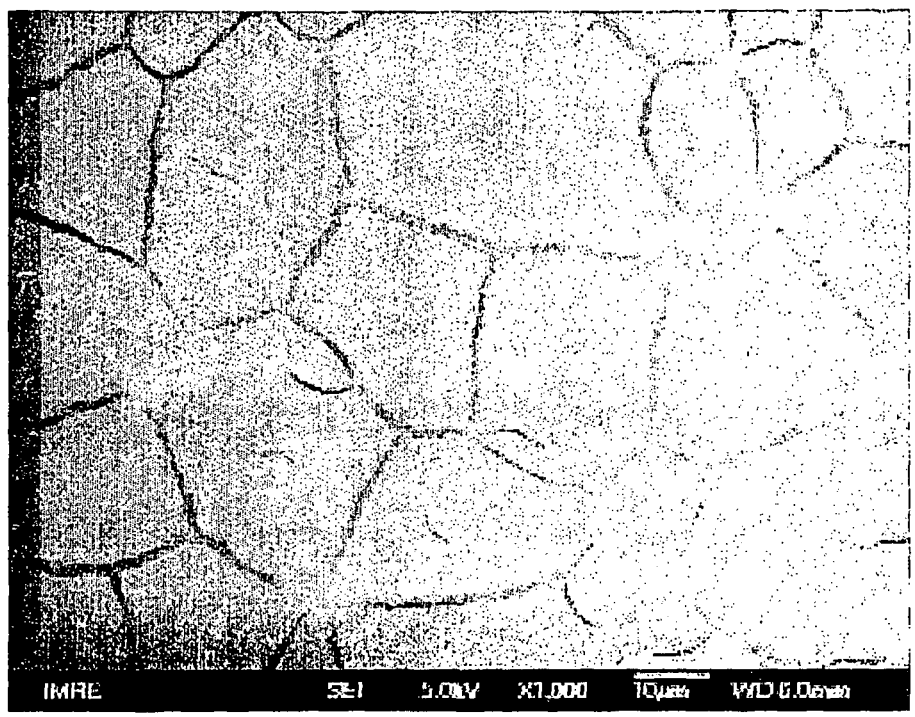
FIG. 7 illustrates a SEM image of a preliminary β-phase VDF oligomer film formed using the method of FIG. 1 before the hot-pressing treatment.

FIG. 6 shows a XRD pattern of a VDF oligomer film formed from a VDF oligomer precursor solution with hydrated salt and FIG. 7 shows a SEM image of a preliminary VDF oligomer film formed from a VDF oligomer precursor solution with hydrated salt before performing the hot-pressing treatment at 110 of method 100. As shown in FIG. 6, when hydrated salt is added into the VDF oligomer precursor solution at 102, the VDF oligomer film crystallized into a polar β-phase dominant structure with the all-trans conformation. Results from the Fourier Transform Infrared (FTIR) Spectroscopy (not shown) are found to be consistent with the XRD results as shown in FIG. 6. A VDF oligomer film with a polar β-phase dominant structure with the all-trans conformation formed before the hot-pressing treatment is referred to as a preliminary β-phase VDF oligomer film. The SEM image of FIG. 7 shows that there are also many inter-spherulite cracks in the preliminary β-phase VDF oligomer film. These cracks are seriously detrimental to the use of the preliminary β-phase VDF oligomer film for any electrical application. All the preliminary β-phase VDF oligomer films with the inter-spherulite cracks are short-circuited and no electrical device can be formed using any of these preliminary β-phase VDF oligomer films.

Figure 8:
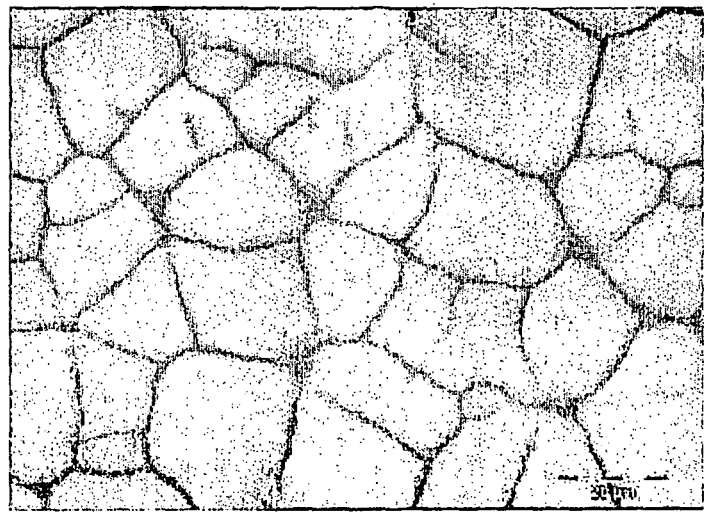
FIGS. 8(a) and 8(b) respectively illustrate an optical image of a preliminary β-phase VDF oligomer film formed using the method of FIG. 1 before the hot-pressing treatment and an optical image of a β-phase VDF oligomer film formed using the method of FIG. 1 after the hot-pressing treatment.
Figure 8:
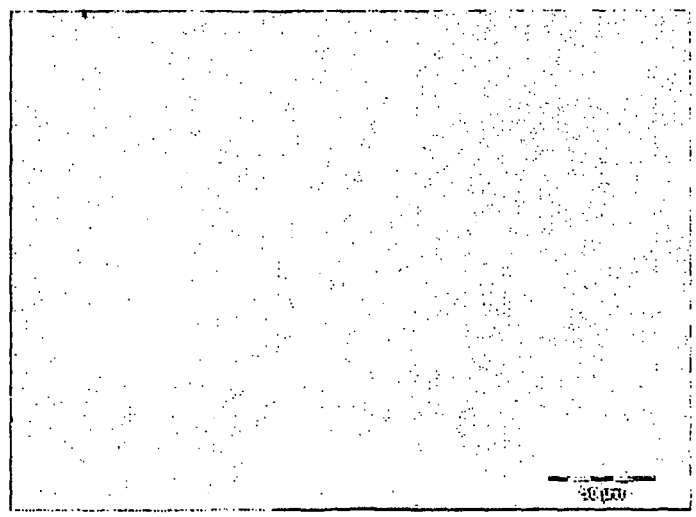
Figure 9:
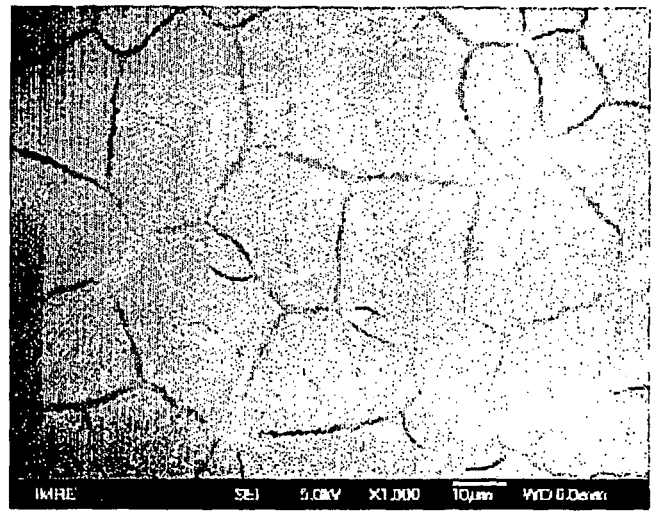
FIGS. 9(a) and 9(b) respectively illustrate a SEM image of a preliminary β-phase VDF oligomer film formed using the method of FIG. 1 before the hot-pressing treatment and a SEM image of a β-phase VDF oligomer film formed using the method of FIG. 1 after the hot-pressing treatment.
Figure 9:
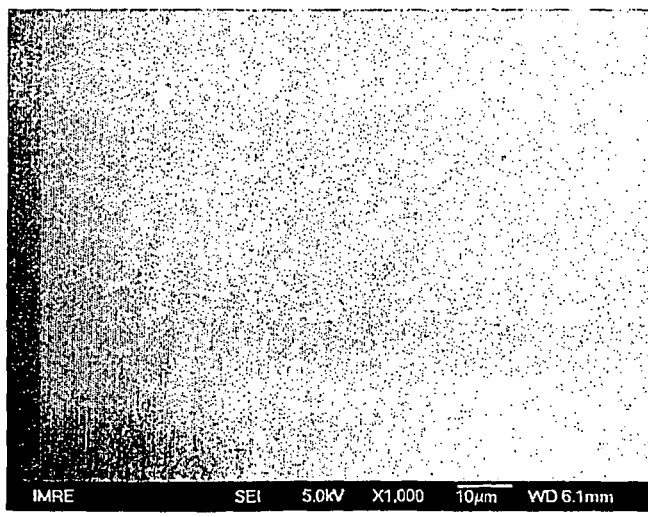

FIGS. 8(*a*) and 8(*b*) respectively illustrate an optical image of a preliminary β-phase VDF oligomer film formed using method 100 before the hot-pressing treatment and an optical image of a β-phase VDF oligomer film formed using method 100 after the hot-pressing treatment. FIGS. 9(*a*) and 9(*b*) respectively illustrate a SEM image of a preliminary β-phase VDF oligomer film formed using method 100 before the hot-pressing treatment and a SEM image of a β-phase VDF oligomer film formed using method 100 after the hot-pressing treatment. As shown in FIGS. 8(*a*)-(*b*) and 9(*a*)-(*b*), all the cracks in the preliminary β-phase VDF oligomer film (as shown in FIGS. 8(*a*) and 9(*a*)) disappear completely after the hot-pressing treatment at 110, giving rise to a smooth and flat surface in the final β-phase VDF oligomer film (as shown in FIGS. 8(*b*) and 9(*b*)). Thus, by using the hot-pressing treatment at 110 wherein uniaxial pressure is applied onto the preliminary β-phase VDF oligomer film and the substrate at an elevated temperature, the cracks in the preliminary β-phase VDF oligomer film can be removed, allowing the resulting β-phase VDF oligomer film to have a higher density. The same effect is achieved by applying the hot-pressing treatment at 110 on the preliminary α-phase VDF oligomer film and its substrate.

Figure 10:
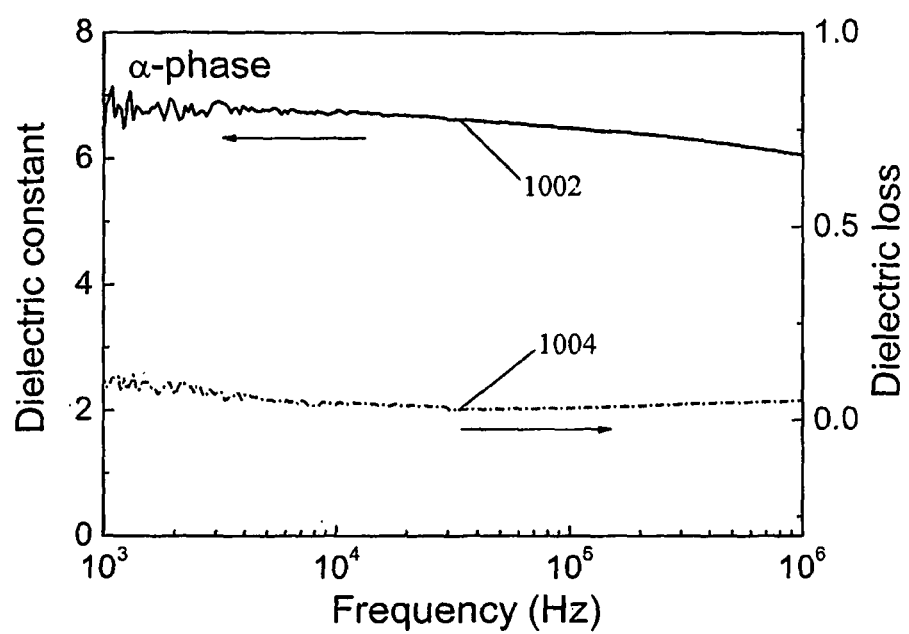
FIG. 10 illustrates dielectric properties of an α-phase VDF oligomer film formed using the method of FIG. 1 after the hot-pressing treatment.
Figure 11:
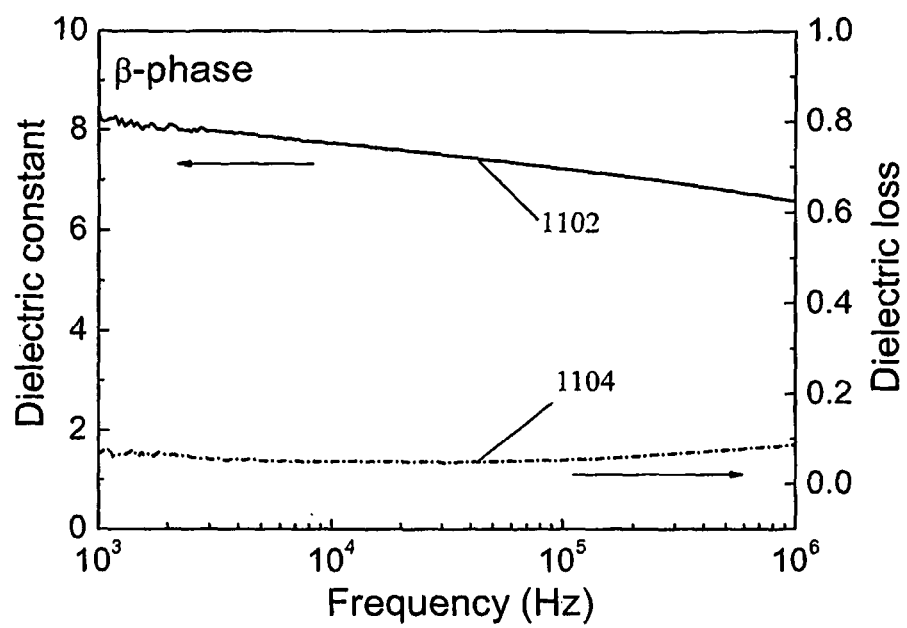
FIG. 11 illustrates dielectric properties of a β-phase VDF oligomer film formed using the method of FIG. 1 after the hot-pressing treatment.

FIGS. 10 and 11 respectively illustrate dielectric properties of the α and β-phase VDF oligomer films obtained using method 100 after performing the hot-pressing treatment at 110. The representation of lines 1002 and 1004 in FIG. 10, and lines 1102 and 1104 in FIG. 11 are shown by the arrows near the respective lines. More specifically, lines 1002 and 1102 plot dielectric constants of the VDF oligomer films against different frequencies whereas lines 1004 and 1104 plot dielectric losses of the VDF oligomer films against different frequencies. The dielectric constants for the α and β-phase VDF oligomer films were found to be about 6.8 and 8.2 respectively whereas the dielectric losses for the α and β-phase VDF oligomer films were found to be 0.086 and 0.070 at 1 kHz respectively. Low dielectric losses were observed for both the α and β-phase VDF oligomer films for frequencies at least up to 1 MHz. Furthermore, the dielectric strengths for the α and β-phase VDF oligomer films were found to be at least above 360 and 400 MV/m respectively. The low dielectric losses and high dielectric strengths of the α and β-phase VDF oligomer films after performing the hot-pressing treatment at 110 show that these α and β-phase VDF oligomer films are effective dielectric materials and are useful in the formation of electrical devices.

Figure 12:
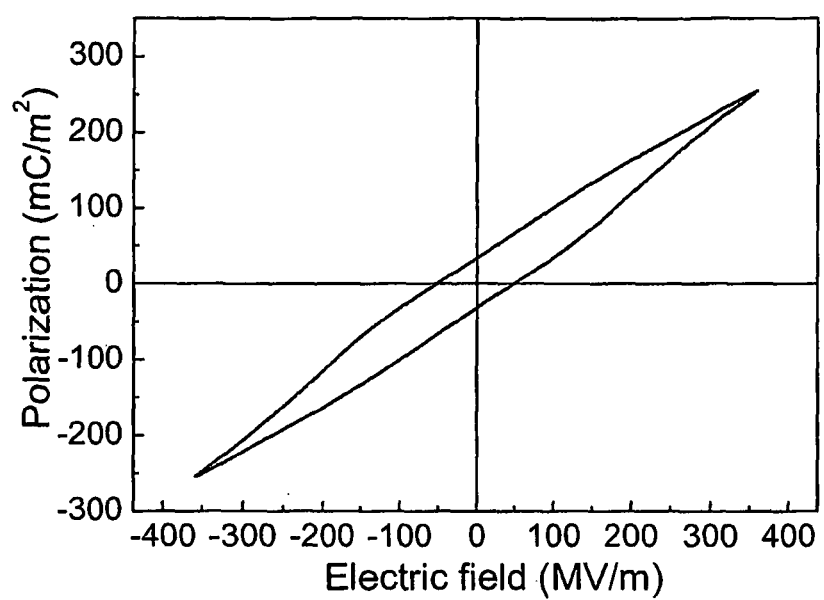
FIG. 12 illustrates a polarization hysteresis loop of an α-phase VDF oligomer film formed using the method of FIG. 1 after the hot-pressing treatment.
Figure 13:
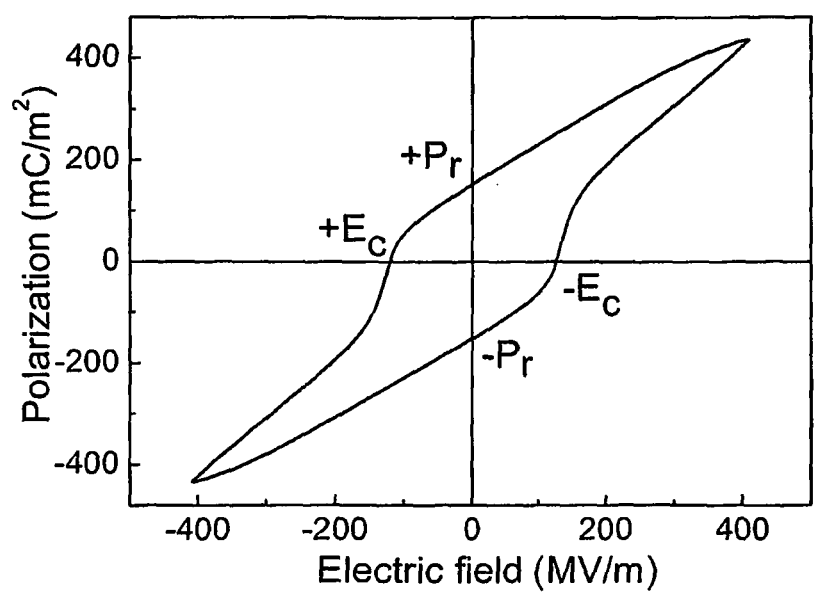
FIG. 13 illustrates a polarization hysteresis loop of a β-phase VDF oligomer film formed using the method of FIG. 1 after the hot-pressing treatment.

FIG. 12 illustrates a polarization hysteresis loop of an α-phase VDF oligomer film formed using method 100 after performing the hot-pressing treatment at 110. The polarization hysteresis loop in FIG. 12 is obtained under a bipolar electric field. As shown in FIG. 12, this α-phase VDF oligomer film exhibits a nearly linear and large dielectric polarization with a small hysteresis. The electrical polarization of this α-phase VDF oligomer film was found to be 255 mC/m² at an electric field of 360 MV/m. FIG. 13 illustrates a polarization hysteresis loop of a β-phase VDF oligomer film formed using method 100 after performing the hot-pressing treatment at 110. The polarization hysteresis loop in FIG. 13 is obtained under a bipolar electric field. As shown in FIG. 13, this β-phase VDF oligomer film exhibits a nonlinear and large dielectric polarization with a large hysteresis. In fact, the polarization of this β-phase VDF oligomer film can reach a level of 435 mC/m² at an electric field of 400 MV/m. After withdrawing the electric field, a remnant polarization ($P_r$ as shown in FIG. 13) above 140 mC/m² (as large as 150 mC/m²) remains.

Figure 14:
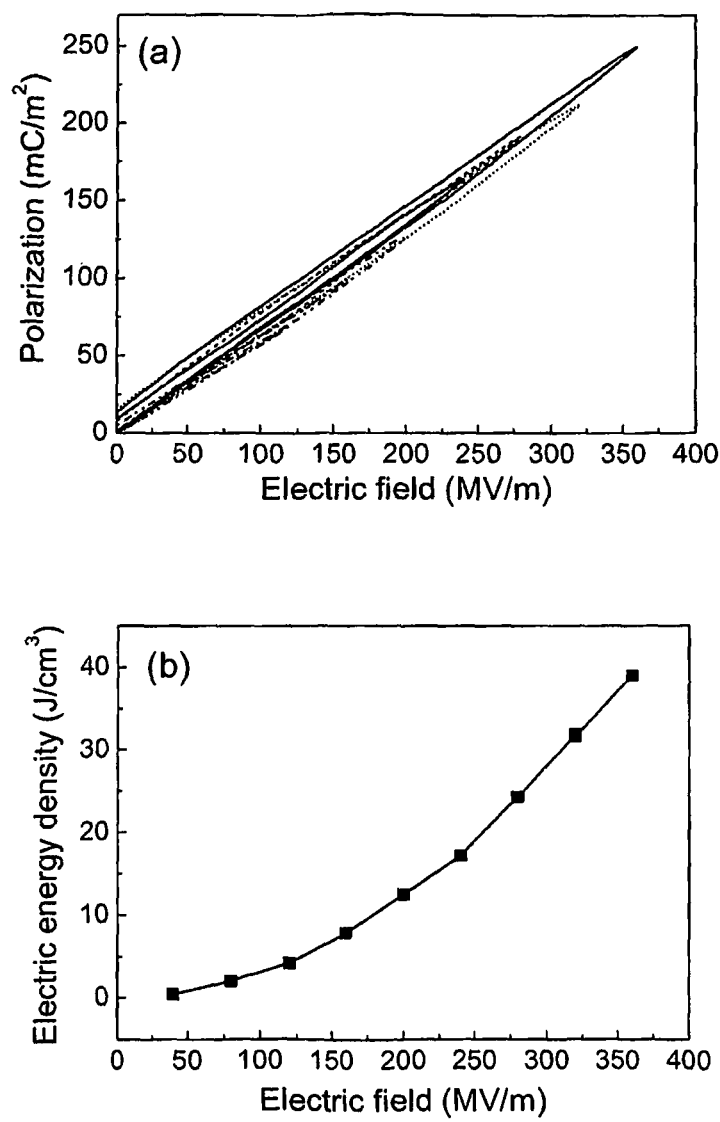
FIGS. 14(a) and 14(b) respectively illustrate the polarization hysteresis loops and the corresponding discharged electric energy densities at different unipolar electric fields for an α-phase VDF oligomer film formed using the method of FIG. 1 after the hot-pressing treatment.
Figure 15:
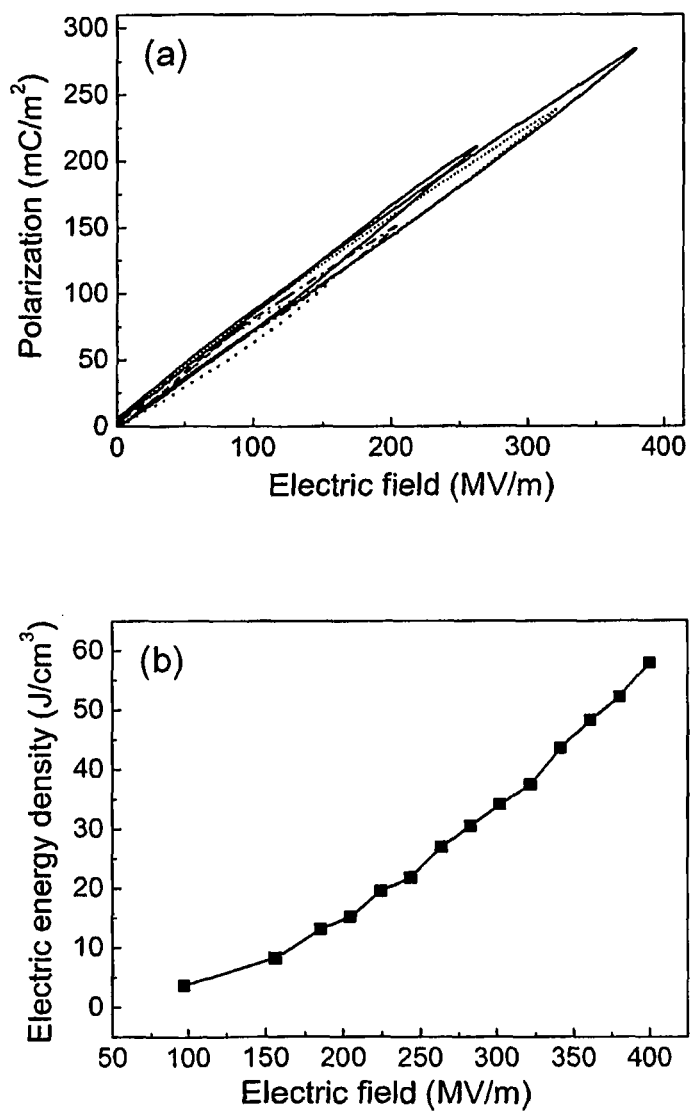
FIGS. 15(a) and 15(b) respectively illustrate the polarization hysteresis loops and the corresponding discharged electric energy densities at different unipolar electric fields for a β-phase VDF oligomer film formed using the method of FIG. 1 after the hot-pressing treatment.

The polarization hysteresis loops and the corresponding discharged electric energy densities at different unipolar electric fields of the α and β-phase VDF oligomer films obtained using method 100 (with the hot-pressing treatment at 110) are illustrated in FIGS. 14 and 15. More specifically, FIGS. 14(a) and 14(b) respectively illustrate the polarization hysteresis loops and the corresponding discharged electric energy densities at different unipolar electric fields for the α-phase VDF oligomer films whereas FIGS. 15(a) and 15(b) respectively illustrate the polarization hysteresis loops and the corresponding discharged electric energy densities at different unipolar electric fields for the β-phase VDF oligomer films. As shown in FIGS. 14 and 15, the β-phase VDF oligomer films achieved a maximum electric energy density of 57.8 J/cm³ at 400 MV/m. This is higher than the largest discharged electric energy density ever reported among the currently known dielectric polymers. The α-phase VDF oligomer film can achieve an electric energy density of above 30 J/cm³ at an electric field of 350 MV/m. Although the maximum electric energy density of 38.9 J/cm³ at 360 MV/m for the α-phase VDF oligomer film is smaller than that of the β-phase VDF oligomer film, it is still about two times the largest electric energy density reported for currently known dielectric polymers at the same electric field. Both the α-phase and β-phase dominant VDF oligomer films obtained from method 100 with the hot-pressing treatment at 110 exhibit unusually large discharged energy density due to their extremely large polarization.

In order to compare the α and β-phase VDF oligomer films obtained from method 100 after performing the hot-pressing treatment against current market-dominant high polar ferroelectric PVDF polymer and P(VDF/TrFE) polymer materials, PVDF polymer and P(VDF/TrFE) copolymer thin films were prepared and tested as well. To investigate the effect of hot-pressing treatment on the polarization of these ferroelectric polymer films, hot-pressing treatment performed in the same manner as described at 110 of method 100 was performed on some of the PVDF and P(VDF/TrFE) films deposited on substrates.

Figure 16:
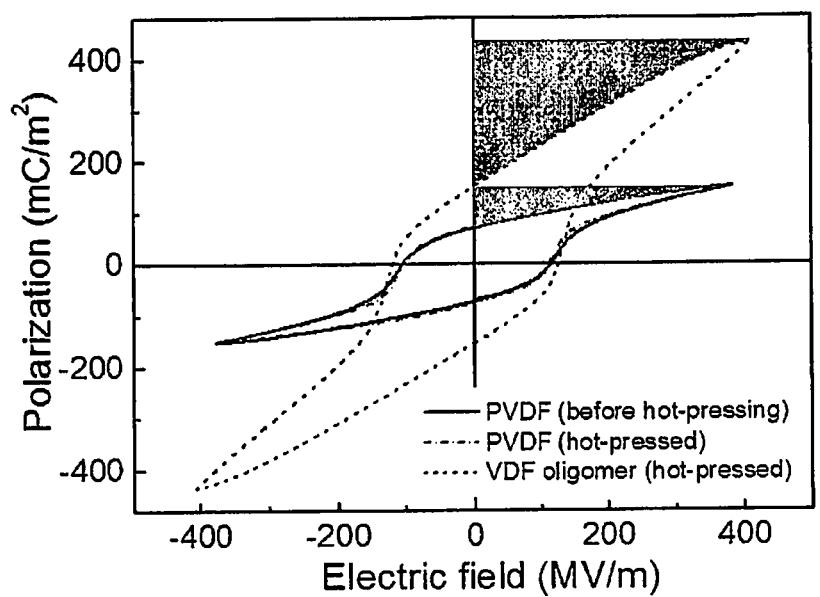
FIG. 16 illustrates a comparison between the polarization hysteresis loops of a β-phase VDF oligomer film formed using the method of FIG. 1 after the hot-pressing treatment and PVDF films obtained before and after hot-pressing treatment.
Figure 17:
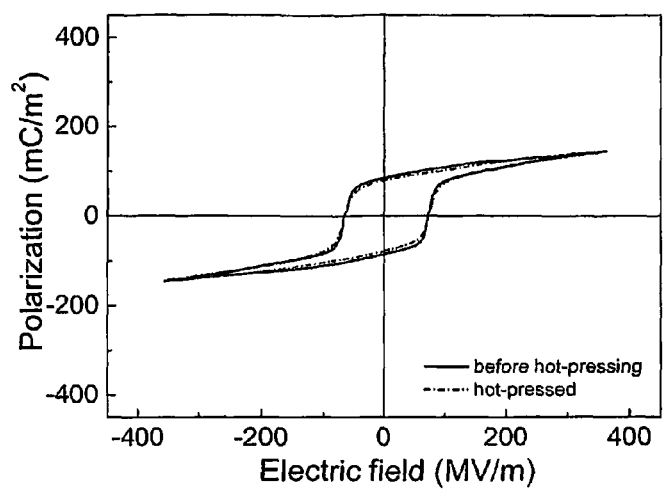
FIG. 17 illustrates the polarization of β-phase P(VDF/TrFE) copolymer films formed before and after hot-pressing treatment.

FIG. 16 illustrates the comparison between the polarization hysteresis loops of the β-phase VDF oligomer film obtained from method 100 (after the hot-pressing treatment at 110) and the PVDF films (before and after performing hot-pressing treatment). The shaded areas in FIG. 16 show the discharged energy of the β-phase VDF oligomer film and the PVDF films. As shown in FIG. 16, the β-phase VDF oligomer films as obtained from method 100 with the hot-pressing treatment exhibits a much higher discharged electric energy density as compared to the PVDF films (both before and after performing the hot-pressing treatment). The polarization of the β-phase P(VDF/TrFE) copolymer films obtained before and after the hot pressing treatment is presented separately in FIG. 17 for clarity. As shown in FIGS. 16 and 17, the largest polarization $P_m$ and remnant polarization $P_r$ of the β-phase VDF oligomer films obtained from method 100 after the hot-pressing treatment are both significantly higher than those of the β-phase PVDF polymer and P(VDF/TrFE) copolymer materials (regardless whether the hot-pressing treatment was performed). The remnant polarization $P_r$ of the β-phase PVDF polymers and P(VDF/TrFE) copolymers at 400 MV/m was found to be below 90 mC/m², and the maximum polarization $P_m$ was found to be below 160 mC/m². In contrast, both $P_r$ and $P_m$ were found to be much higher ($P_r$=150 mC/m²; $P_m$=435 mC/m²) for the β-phase VDF oligomer film obtained from method 100 with the hot-pressing treatment at 110.

It should be noted that the electrical properties including $P_m$ and $P_r$ for the PVDF polymer and P(VDF/TrFE) copolymers did not change substantially with the hot-pressing treatment. In contrast, electrical shorting is present in the preliminary VDF oligomer films obtained before performing the hot-pressing treatment and no electrical properties, such as $P_m$ and $P_r$, can be obtained for these preliminary VDF oligomer films.

The extremely large polarization of the VDF oligomer films (obtained from method 100 with the hot-pressing treatment at 110) makes them useful for many electrical and ferroelectric devices.

For example, electrical devices formed from the VDF oligomer films (of method 100 with the hot-pressing treatment) sandwiched between two electrodes can be used as high energy density capacitors for power electronics and electric power systems. For a capacitor under an external electric field, electrical charges and energy are first stored in the capacitor and are then discharged after the electric field is withdrawn. The discharged energy per unit volume $U_e$ for the capacitor can be calculated according to Equation (1) where E is the electric field and D is the electric displacement.

$$U_e = \int E \, dD \quad (1)$$

Figure 18:
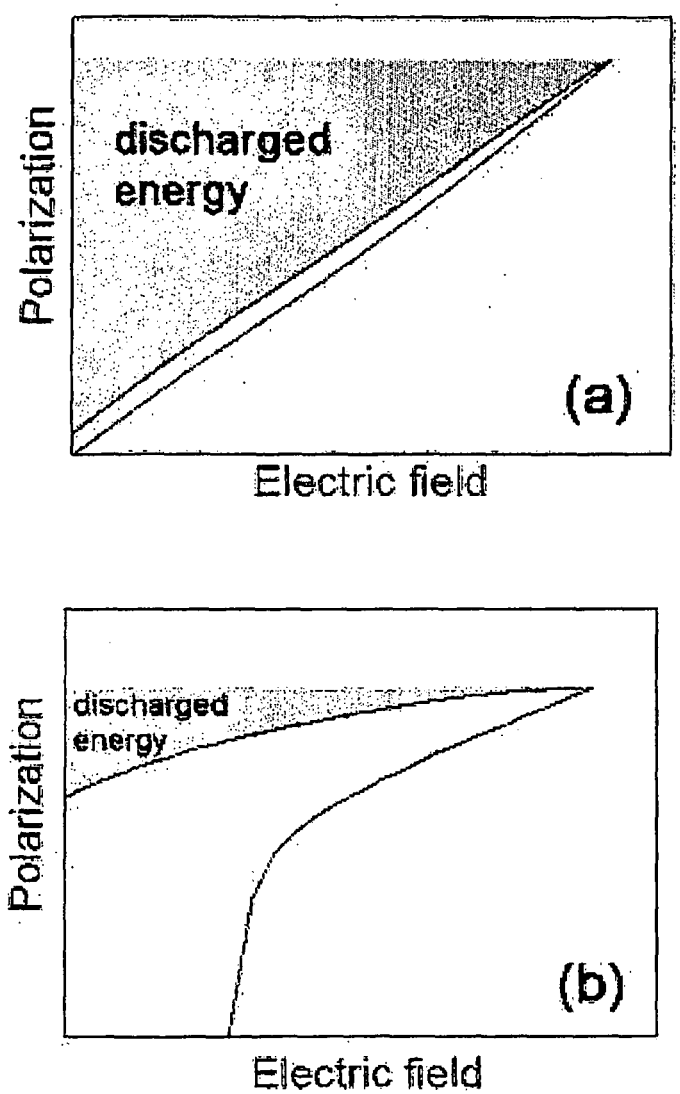
FIGS. 18(a) and 18(b) respectively illustrate the discharged energy densities of a VDF oligomer thin film electrical device comprising the VDF oligomer film formed using the method of FIG. 1 under a unipolar electric field and under a bipolar electric field.

With the large polarization achieved by the VDF oligomer film of method 100, the electric displacement of the VDF oligomer thin film electrical device formed from the VDF oligomer film of method 100 is approximately equal to the polarization of the film. The discharged energy per unit volume (energy density) over one AC electric field cycle for the VDF oligomer thin film electrical device formed from a VDF oligomer film of method 100 (after performing the hot-pressing treatment) is illustrated in FIG. 18. More specifically, FIGS. 18(*a*) and 18(*b*) respectively illustrate the discharged energy densities (as shaded above the polarization hysteresis loops) of the VDF oligomer thin film electrical device under a unipolar electric field and under a bipolar electric field. Only the first quadrant of the hysteresis loop is shown in FIG. 18(*b*) (which illustrates the discharged energy density of the VDF thin film electrical device under the bipolar electric field). As shown in FIGS. 14-15 and 18, capacitors made of VDF oligomer films obtained from method 100 (after performing the hot-pressing treatment) will be particularly useful as energy storage devices because of their extremely large energy densities. In fact, capacitors with a unprecedentedly high energy density above 50 J/cm$^3$ at an electric field of 400 MV/m can be obtained with the VDF oligomer films obtained from method 100 (with the hot-pressing treatment at 110). Due to the nature of the dielectric-based energy storage mechanism, such energy storage, devices are characterized with a high discharging rate and a high power output.

The VDF oligomer thin film electrical devices formed from β-phase VDF oligomer films (of method 100 after performing the hot-pressing treatment) sandwiched between two electrodes can also be used effectively as charge storage capacitors in ferroelectric random access memories (FRAM). For example, as shown in FIG. 13, remnant polarization in the β-phase VDF oligomer film of method 100 is present in two different directions, i.e. $+P_r$ and $-P_r$, which correspond to two different "0" and "1" status. In addition, the polarization direction can be switched in response to an external field larger than the coercive field $-E_c$ and $+E_c$. This switchable remnant polarization allows the charge storage capacitors formed from β-phase VDF oligomer films of method 100 to have nonvolatile memory functions. The β-phase VDF oligomer film has an extremely large remnant polarization up to 150 mC/m$^2$ after the external electric field is withdrawn. This is significantly larger than that of the PVDF-based ferroelectric polymer, which is typically below 90 mC/m$^2$. In fact, this may be higher than the remnant polarization of all the currently known ferroelectric vinylidene fluoride oligomers and co-oligomers, and poly(vinylidene fluoride) (PVDF) polymers and co-polymers. In the FRAM, the miniaturization of the capacitors is often limited by the smallest detectable charge or polarization. Thus, with the extremely large remnant polarization, the β-phase VDF oligomer films when used as charge storage capacitors in a FRAM can allow the FRAM to have smaller capacitor sizes and an improved memory density.

It is also known that the polarization of ferroelectric materials is a function of temperature, and changes of temperature causes changes in polarization and results in pyroelectric potential and current. On the basis of this principle, ferroelectric materials can be used as non-contact temperature sensors and infrared detectors. VDF oligomer thin film electrical devices formed from β-phase VDF oligomer films (obtained from method 100 after performing the hot-pressing treatment at 110) sandwiched between two electrodes can thus be used as pyroelectric sensors. The large remnant polarization of the β-phase VDF oligomer films can enhance the change in polarization in response to the change of temperature, thus improving the pyroelectric coefficient and the sensitivity for infrared detection and non-contact temperature measurement. Furthermore, their large polarization and relatively low dielectric constants can achieve a high figure of merit for pyroelectric detection.

All ferroelectric materials also have piezoelectric properties, in which electric potential or current is generated in response to the strain under mechanical stimuli, such as force, pressure, and vibration. On the basis of this principle, the VDF oligomer thin film electrical devices formed from β-phase VDF oligomer films (obtained from method 100 after performing the hot-pressing treatment at 110) sandwiched between two electrodes can also be used as piezoelectric sensors to detect strain, stress, force, pressure and vibration. The high polarization and relatively low dielectric constants of the β-phase VDF oligomer films can allow the piezoelectric sensors formed from them to produce a high voltage output in response to a small mechanical stimulus. Furthermore, due to the large remnant polarization of the β-phase VDF oligomer film, a large electric output can be produced when the β-phase VDF oligomer film is subject to a strain. This hence enhances the sensitivity of the piezoelectric sensor.

Thus, method 100 is advantageous as the VDF oligomer films obtained from method 100 (with the hot-pressing treatment at 110) have excellent electrical properties and hence can be effectively used in many applications such as in high energy density capacitors for power electronics, electrical power systems, medical devices (for example defibrillators) and electric weapons, in FRAM, in pyroelectric devices for infra red and non-contact temperature detection, and in piezoelectric sensors.

It is not unknown to apply pressure in the preparation of polymer films. However, it is not immediately evident that the same technique can be used on VDF oligomer films. As described above, unexpected effects and performance properties are obtained in the VDF oligomer films of method 100. Unlike PVDF polymer films, VDF oligomer films cannot be prepared as self-supported films without substrates. Hence, the pressure has to be applied on both the VDF oligomer film and the substrate. Since the substrate is usually fragile, it is challenging to apply pressure on the VDF oligomer film and the substrate without breaking the substrate. Furthermore, there is no suggestion from the prior art or common general knowledge that it is possible to eliminate all the cracks in VDF oligomer film, in turn achieving the unexpected electrical properties of the VDF oligomer film, by applying pressure on the VDF oligomer film which is in-plane constrained by its substrate.

Method 100 is also advantageous as it can successfully induce the polar β-phase of the VDF oligomer film with the all trans conformation by introducing hydrated salt in the VDF oligomer precursor solution. In other words, the dominant crystalline phase of the VDF oligomer film (either non-polar α phase, or all-trans polar ferroelectric β phase) can be successfully controlled in method 100. It is not entirely unknown to use hydrated salt to promote the β-phase of polymers. However, there is no indication that it is also possible to induce the β-phase of VDF oligomers or co-oligomers using hydrated salt.

In addition, the VDF oligomer precursor solution typically does not wet well on metal electrode materials such as Au or Al surfaces. Hence, it is difficult to form a continuous and smooth VDF oligomer film directly on a metal surface. Method 100 has the advantage that continuous and smooth VDF oligomer films can be obtained by using substrates with chemically functionalized metal surfaces (at 104) to improve the wetting ability of the VDF oligomer precursor solutions on the metal surfaces.

Table 1 shows a comparison between VDF oligomer thin films obtained from method 100 which is an embodiment of the present invention and other polymer dielectric materials in the prior art. As shown in Table 1, it can be seen that the VDF oligomer films obtained from method 100 with the hot-pressing treatment at 110 exhibit the largest energy density as compared to the other polymer dielectric materials. These VDF oligomer films can also achieve a higher remnant polarization and a higher maximum polarization than all the organic dielectric materials currently known.

Whilst the foregoing description has described exemplary embodiments, it will be understood by those skilled in the technology concerned that many variations in details of design, construction and/or operation may be made without departing from the present invention.

TABLE 1

| Material | Preparation Method | Thickness (μm) | Largest energy density at Em (J/cm$^3$) | Maximum field Em (MV/m) | Energy density at 400 MV/m |
|---|---|---|---|---|---|
| β-phase VDF oligomer | Method 100 with hot-pressing treatment at 110 | 1~4 | 57.8 | 400 | 57.8 |
| α-phase VDF oligomer | Method 100 with hot-pressing treatment at 110 | 1~4 | 38.9 | 360 | |
| P(VDF/HFP) | Extrusion & drawing | 3~11 | 25 | 700 | 10 |
| Polyurea | Thermal evaporation | 2.5 | 12 | 800 | 3 |
| Polypropylene (PP) | | | 1~1.2 | 640 | |
| Polyester (PET) | | | 1~1.5 | 570 | |
| Polycarbonate (PC) | | | 0.5~1 | 528 | |
| P(VDF/CTFE) | | | 25 | 620 | |
| Polyimide | | | 1~1.5 | 300 | |
| P(VDF/CTFE/TrFE) | | | 10.3 | 500 | 9 |
| Polystyrene + carbon nanotube | Solution casting | 30 | 4.95 | 216 | |
| Uniaxially stretched P(VDF/TrFE/CTFE) | Solution casting | 20 | 10.5 | 400 | 10.5 |
| Polystyrene grafted P(VDF/CTFE) | Solution casting & stretch | 15~20 | 3.8 | 400 | 3.8 |
| P(VDF/CTFE) & P(VDF/CTFE/TrFE) | Solution casting | 12~20 | 11.5 | 370 | |
| P(VDF/CTFE/TrFE) | | | 13 | 500 | 9 |
| P(VDF/TrFE/CFE) | Solution casting | 12~20 | 10.5 | 300 | |
| P(VDF/TrFE/CFE) | Solution casting | 10~15 | 10 | 350 | |
| P(VDF/CTFE/TrFE) | Solution casting | 20 | 9 | 400 | 9 |
| P(VDF/CTFE) | Melt-compress-stretch | | 17 | 570 | 9 |
| P(VDF/TrFE/CFE) | Solution casting | 10~15 | 10 | 350 | |
| PVDF homopolymer, copolymer, terpolymers | Solution casting/ Melt and press/ Extrusion | 10~15 | 17 | 570 | 9 |
| P(VDF/HFP) | | | 25 | 700 | 10.5 |
| Polymer electrolyte & BT nanoparticles | | | 1440 | | |
| blends of PVDF and Polypropylene | Extrusion | 0.5~25 | 5 | | |

What is claimed is:

1. A method of forming a VDF oligomer or co-oligomer film on a substrate, the method comprising:
   forming a VDF oligomer or co-oligomer precursor solution;
   depositing the VDF oligomer or co-oligomer precursor solution onto the substrate to form a preliminary VDF oligomer or co-oligomer film on the substrate; and
   applying uniaxial pressure on the preliminary VDF oligomer or co-oligomer film and the substrate at an elevated temperature in the range of 80° C.-135° C. to form the VDF oligomer or co-oligomer film on the substrate.

2. A method as claimed in claim 1, wherein prior to applying uniaxial pressure on the preliminary VDF oligomer or co-oligomer film and the substrate at an elevated temperature, the preliminary VDF oligomer or co-oligomer film and the substrate are annealed at a temperature between 100° C.-150° C. for crystallization.

3. A method as claimed in claim 1, wherein the forming of the VDF oligomer or co-oligomer precursor solution further comprises dissolving solid VDF oligomer or co-oligomer in a solvent comprising dimethylformamide and acetone to form the VDF oligomer or co-oligomer precursor solution.

4. A method as claimed in claim 1, wherein the forming of the VDF oligomer or co-oligomer precursor solution further comprises adding a hydrated salt to the VDF oligomer or co-oligomer precursor solution.

5. A method as claimed in claim 4, wherein the hydrated salt is aluminium nitrate nonahydrate.

6. A method as claimed in claim 1, wherein the substrate comprises a chemically functionalized metal surface.

7. A method as claimed in claim 6, wherein the metal surface is chemically functionalized by treating the metal surface with 3-mercaptopropionic acid.

8. A method as claimed in claim 1, wherein the depositing of the VDF oligomer or co-oligomer precursor solution onto the substrate is performed using a solution casting process.

9. A method as claimed in claim 1, wherein the uniaxial pressure applied on the preliminary VDF oligomer or co-oligomer film and the substrate is in the range of 1 MPa-300 MPa.

10. A method as claimed in claim 9, wherein the uniaxial pressure applied on the preliminary VDF oligomer or co-oligomer film and the substrate is in the range of 30 MPa-120 MPa.

11. A method as claimed in claim 1, wherein the applying of the uniaxial pressure on the preliminary VDF oligomer or co-oligomer film and the substrate at an elevated temperature comprises:
   placing a first plate on the preliminary VDF oligomer or co-oligomer film;
   placing a second plate below the substrate; and
   applying the uniaxial pressure onto the preliminary VDF oligomer or co-oligomer film and the substrate through the first plate and the second plate respectively.

12. A method as claimed in claim 11, further comprising placing a polymer sheet between the first plate and the preliminary VDF oligomer or co-oligomer film prior to applying the uniaxial pressure.

13. A method as claimed in claim 11, further comprising placing an elastic cushion layer between the second plate and the substrate prior to applying the uniaxial pressure.

14. A method of forming an electrical device with a VDF oligomer or co-oligomer film, the method comprising:
   forming a substrate comprising a bottom electrode;
   forming the VDF oligomer or co-oligomer film on the substrate, wherein the formation of the VDF oligomer or co-oligomer film on the substrate comprises:
      forming a VDF oligomer or co-oligomer precursor solution;
      depositing the VDF oligomer or co-oligomer precursor solution onto the substrate to form a preliminary VDF oligomer or co-oligomer film on the substrate; and
      applying uniaxial pressure on the preliminary VDF oligomer or co-oligomer film and the substrate at an elevated temperature in the range of 80° C.-135° C. to form the VDF oligomer or co-oligomer film on the substrate; and
   depositing a top electrode on the VDF oligomer or co-oligomer film to form the electrical device.

* * * * *